United States Patent
Lengade et al.

(10) Patent No.: US 9,093,636 B2
(45) Date of Patent: Jul. 28, 2015

(54) INCORPORATION OF OXYGEN INTO MEMORY CELLS

(75) Inventors: Swapnil Lengade, Boise, ID (US); Dale W. Collins, Boise, ID (US); Durai Vishak Nirmal Ramaswamy, Boise, ID (US); Yongjun Jeff Hu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/361,296

(22) Filed: Jan. 30, 2012

(65) Prior Publication Data

US 2013/0193394 A1    Aug. 1, 2013

(51) Int. Cl.
H01L 47/00 (2006.01)
H01L 21/02 (2006.01)
H01L 45/00 (2006.01)

(52) U.S. Cl.
CPC ............ *H01L 45/08* (2013.01); *H01L 45/1266* (2013.01); *H01L 45/146* (2013.01); *H01L 45/165* (2013.01)

(58) Field of Classification Search
USPC .............................................. 257/4; 438/382
See application file for complete search history.

(56) References Cited

U.S. PATENT DOCUMENTS

| | | | |
|---|---|---|---|
| 6,348,373 B1 * | 2/2002 | Ma et al. | 438/240 |
| 7,060,586 B2 | 6/2006 | Li et al. | |
| 2008/0247214 A1 | 10/2008 | Ufert | |
| 2010/0038791 A1 | 2/2010 | Lee et al. | |
| 2010/0155687 A1 * | 6/2010 | Reyes et al. | 257/4 |
| 2010/0163819 A1 | 7/2010 | Hwang | |
| 2010/0270609 A1 | 10/2010 | Olsen et al. | |
| 2012/0126195 A1 * | 5/2012 | Ignatiev et al. | 257/2 |
| 2012/0295398 A1 * | 11/2012 | Kurunczi et al. | 438/104 |

OTHER PUBLICATIONS

Popak et al., "Design and Capabilities of a Cluster Implantation and Deposition Apparatus: First results on Hillock Formation Under Energetic Cluster Ion Bombardment", Review of Scientific Instruments, vol. 73 (12), p. 4283 (2002).*
Bishop, S. M., et al., "Ion Implantation Synthesized Copper Oxide-based Resistive Memory Devices", Applied Physics Letters, vol. 99, 202102, (2011), 4 pages.
Fang, Z., et al., "Resistive RAM Based on $Hfo_x$ and its Temperature Instability Study", World Academy of Science, Enginerring and Technology, vol. 72, (2010), 907-909.
Zhang, Haowei, et al., "Ionic Doping effect in $ZrO_2$ Resistive Switching Memory", Applied Physics Letters, 96(12), (2010), 3 pgs.

* cited by examiner

*Primary Examiner* — Asok K Sarkar
(74) *Attorney, Agent, or Firm* — Schwegman Lundberg & Woessner, P.A.

(57) ABSTRACT

Electronic apparatus, systems, and methods include a resistive random access memory cell having an oxygen gradient in a variable resistive region of the resistive random access memory cell and methods of forming the resistive random access memory cell. Oxygen can be incorporated into the resistive random access memory cell by ion implantation. Additional apparatus, systems, and methods are disclosed.

32 Claims, 13 Drawing Sheets

INCORPORATION OF OXYGEN INTO MEMORY CELLS

BACKGROUND

The semiconductor device industry has a market driven need to improve operation of memory devices. Improvements to memory devices such as resistive random access memories can be addressed by advances in memory device design. Enhancements in memory devices can also be realized by advances in processing.

DETAILED DESCRIPTION

The following detailed description refers to the accompanying drawings that show, by way of illustration, various embodiments of the invention. These embodiments are described in sufficient detail to enable those of ordinary skill in the art to practice these and other embodiments. Other embodiments may be utilized, and structural, logical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

Figure 1:
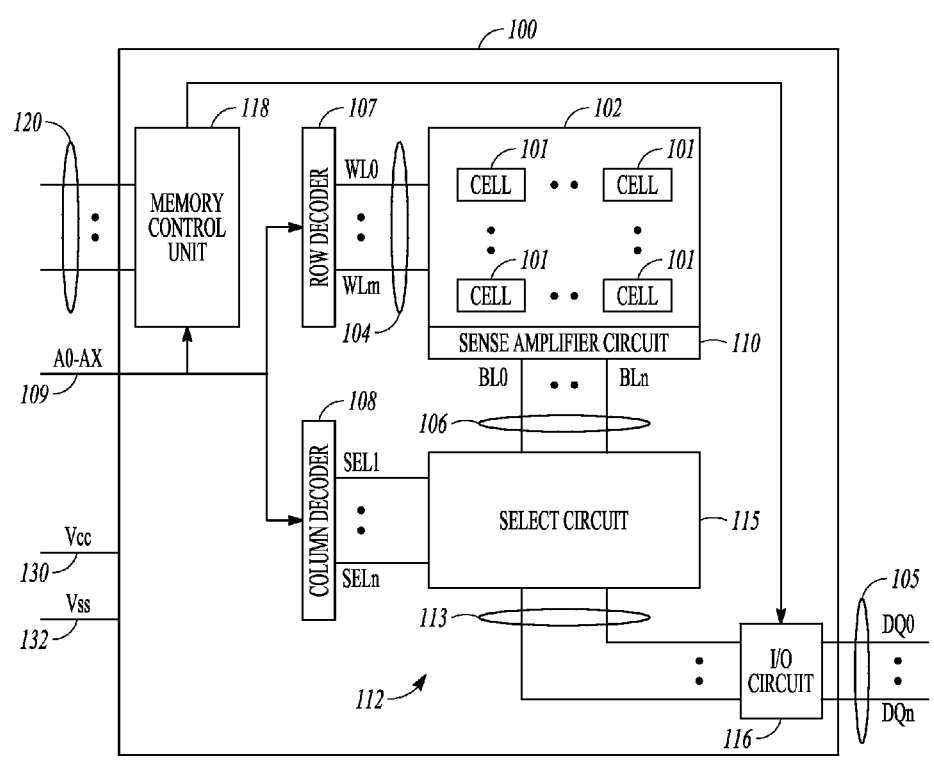
FIG. 1 shows a block diagram of an example memory device, in accordance with various embodiments.

FIG. 1 shows a block diagram of an example embodiment of a memory device 100. Memory device 100 can include a memory array 102 having a plurality of memory cells 101. Memory cells 101 can be arranged in rows and columns along with access lines 104 and first data lines 106. For example, access lines can be structured as wordlines to conduct signals WL0 through WLm and first data lines can be structured as bit lines to conduct signals BL0 through BLn. Memory device 100 can use access lines 104 and first data lines 106 to transfer information to and from memory cells 101. A row decoder 107 and a column decoder 108 decode address signals A0 through AX on address lines 109 to determine which ones of memory cells 101 are to be accessed.

A sense amplifier circuit 110 operates to determine the value of information read from memory cells 101 and the information read is communicated in the form of signals to first data lines 106. Sense amplifier circuit 110 can also use the signals on first data lines 106 to determine values of information to be written to memory cells 101.

Memory device 100 can include circuitry 112 to transfer information between memory array 102 and input/output (I/O) lines 105. Signals DQ0 through DQN on the I/O lines 105 can represent information read from or written into memory cells 101. I/O lines 105 can include nodes within memory device 100 (or alternatively, pins, solder balls, or other interconnect technologies such as controlled collapse chip connection (C4), or flip chip attach (FCA)) on a package where the memory device 100 can reside. Other devices external to memory device 100 can communicate with memory device 100 through I/O lines 105, address lines 109, or control lines 120. For example, such external devices can include a memory controller or a processor.

Memory device 100 can perform memory operations, such as a read operation, to read information from selected ones of memory cells 101 and a programming operation (also referred to as a write operation) to program (e.g., to write) information into selected ones of memory cells 101. Memory device 100 can also perform a memory erase operation to clear information from some or all of memory cells 101. A memory control unit 118 controls memory operations based on signals on control lines 120. Examples of the signals on the control lines 120 can include one or more clock signals and other signals to indicate which operation (e.g., a programming or read operation) memory device 100 can or should perform. Other devices external to memory device 100 can control the values of the control signals on the control lines 120. The external devices can include, for example, a processor or a memory controller. Specific values of a combination of the signals on control lines 120 can produce a command, such as a programming or read command for example, that can cause memory device 100 to perform a corresponding memory operation. The corresponding memory operation can include, for example, a program, read, or erase operation.

Each of memory cells 101 can be programmed to store information representing a value of a single bit or a value of multiple bits such as two, three, four, or a higher number of bits. For example, each of memory cells 101 can be programmed to store information representing a binary value "0" or "1" of a single bit. The single bit per cell is sometimes called a single level cell. In another example, each of memory cells 101 can be programmed to store information representing a value representing multiple bits, such as one of four possible values "00," "01," "10," and "11" of two bits, one of eight possible values "000," "001," "010," "011," "100," "101," "110," and "111" of three bits, or one of another set of values of multiple bits. A cell that has an ability to store multiple bits is sometimes referred to as a multi-level cell or multi-state cell.

Memory device 100 can receive a supply voltage, including supply voltage signals Vcc and Vss, on a first supply line 130 and a second supply line 132, respectively. Supply voltage signal Vss can operate at a ground potential. The ground potential can have a value of approximately zero volts. Supply voltage signal Vcc can include an external voltage supplied to memory device 100 from an external power source such as a battery or an alternating current to direct current (AC-DC) converter circuitry.

Circuitry 112 of memory device 100 can include a select circuit 115 and an input/output (I/O) circuit 116. Select circuit 115 can respond to signals SEL1 through SELn to select signals on first data lines 106 and second data lines 113 that can represent the information read from or programmed into memory cells 101. Column decoder 108 can selectively activate the SEL1 through SELn signals based on the A0 through AX address signals on address lines 109. Select circuit 115 can select the signals on first data lines 106 and second data lines 113 to provide communication between memory array 102 and I/O circuit 116 during read and programming operations.

Memory device 100 can include a non-volatile memory device and memory cells 101 can include non-volatile memory cells such that memory cells 101 can retain information stored therein when power is disconnected from memory device 100. The power may be represented by the labels Vcc, Vss, or both.

Each of memory cells 101 can include a memory element having material, at least a portion of which can be programmed to change the resistance value of the material. Each of memory cells 101 can have a state corresponding to a resistance value when each of memory cells 101 is programmed in a programming operation. Different resistance values can thus represent different values of information programmed in each of memory cells 101.

Memory device 100 can perform a programming operation when it receives a programming command and a value of information to be programmed into one or more selected ones of memory cells 101. The programming command can be received from an external processor, a memory controller, or other controller. Based on the value of the information, memory device 100 can program the selected memory cells to cause them to have appropriate resistance values to represent the values of the information stored therein. Memory device 100 may include devices and memory cells, and operate using memory operations similar to or identical to those described below with reference to various other figures and embodiments discussed herein.

Figure 2:
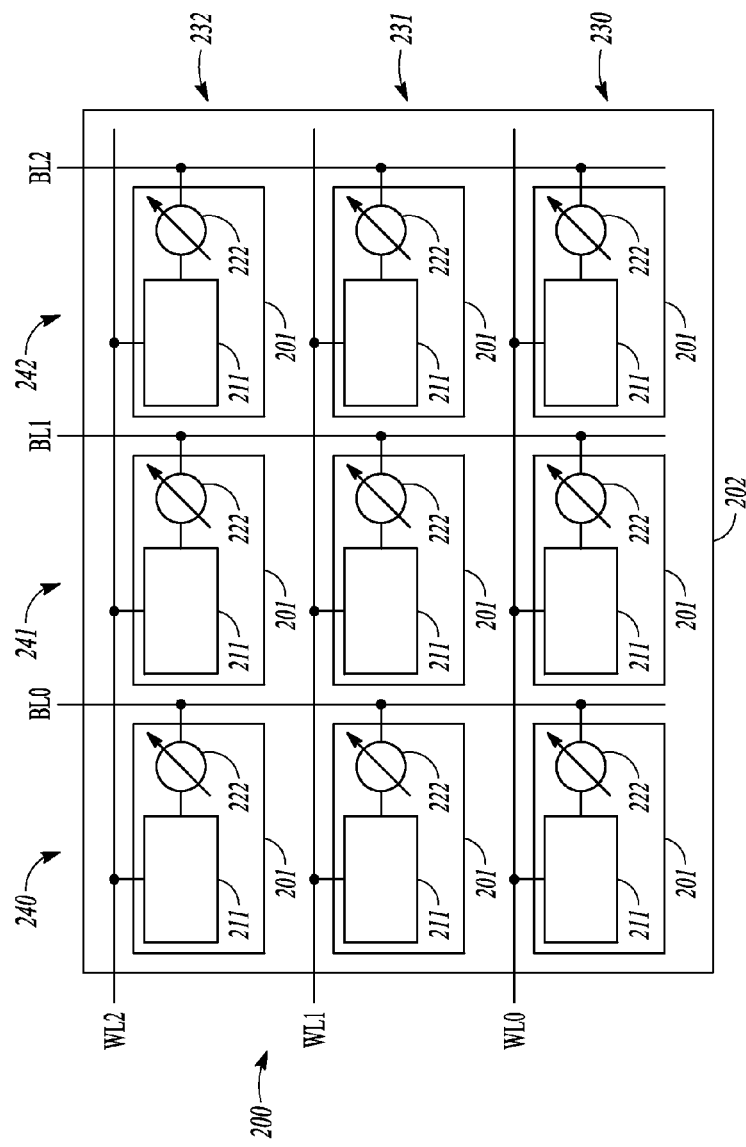
FIG. 2 shows a block diagram of features of an example memory device that includes a memory array having memory cells with access components and memory elements, in accordance with various embodiments.

FIG. 2 shows a block diagram of features of an example embodiment of a memory device 200 that includes a memory array 202 having memory cells 201 with access components 211 and memory elements 222. Memory array 202 may be similar or identical to memory array 102 of FIG. 1. Memory cells 201 can be arranged in a number of rows 230, 231, and 232 along with access lines to conduct signals such as signals WL0, WL1, and WL2. The access lines may be word lines. Memory cells 201 can also be arranged in a number of columns 240, 241, and 242 along with data lines to conduct signals such as signals BL0, BL1, and BL2. The data lines may be bit lines. Access components 211 can turn on, for example by using appropriate values of signals WL0, WL1, and WL2, to allow access to memory elements 222 to read information from or program information into the memory elements 222. Memory array 202 may have more or less than the number of memory cells 201 shown in FIG. 2.

Programming information into memory elements 222 can include causing memory elements 222 to have specific resistance values or specified ranges of resistance values. For a resistive random access memory cell, an electric field can be applied to move oxygen vacancies, which can be enabled by an oxygen gradient established in the operably variable resistance region of the memory cell. Then, reading information from a memory element 222 can include measuring a resistance value of memory element 222. Measuring the resistance can include sensing a value of a current flowing through various ones of memory cells 201. Based on a measured value of the current, a corresponding value of the information stored in the memory can be determined. A determination of the information can be based on the value of the current.

Figure 3:
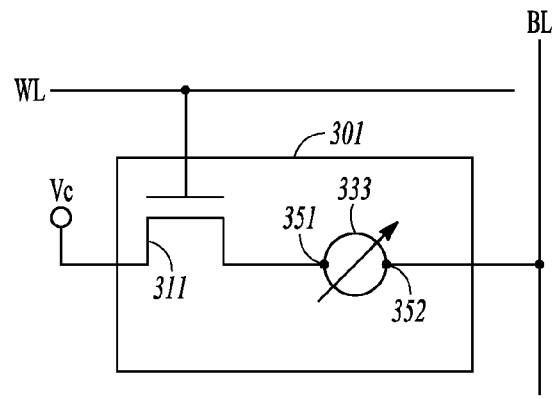
FIG. 3 shows a schematic diagram of an example memory cell having an access component coupled to a memory element, in accordance with various embodiments.
Figure 4:
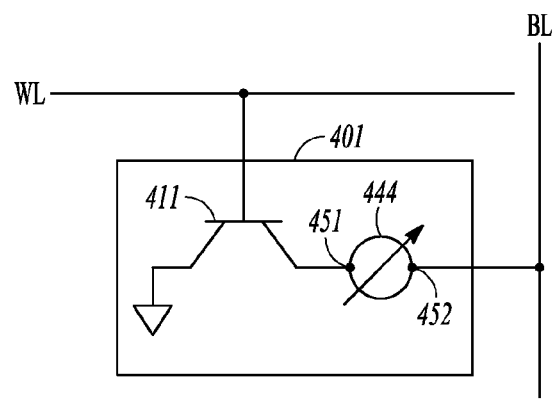
FIG. 4 shows a schematic diagram of an example memory cell having an access component coupled to a memory element, in accordance with various embodiments.
Figure 5:
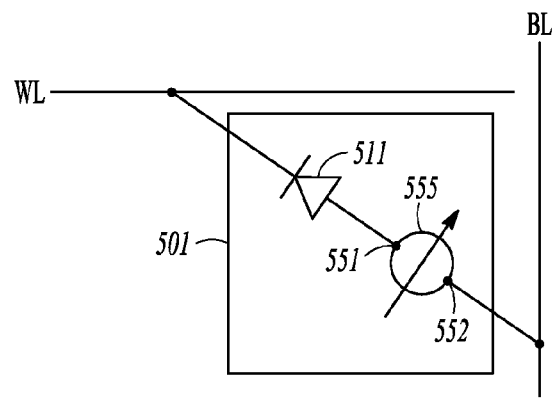
FIG. 5 shows a schematic diagram of an example memory cell having an access component coupled to a memory element, in accordance with various embodiments.

FIGS. 3 through 5 each show a schematic diagram of example embodiments of different memory cells 301, 401, 501 having different access components 311, 411, 511 coupled to memory elements 333, 444, 555, respectively. Lines labeled WL and BL in FIGS. 3 through 5 can correspond to any one of the access lines 104 and any one of the first data lines 106 of FIG. 1, respectively. FIGS. 3 through 5 show examples of access components 311, 411, 511 including a metal-oxide-semiconductor field-effect transistor (MOSFET), a bipolar junction transistor (BJT), and a diode, respectively. Memory cells 301, 401, and 501 can include other types of access components.

Each of the memory elements 333, 444, 555 can be coupled to and disposed between two electrodes, such as a first electrode 351 and a second electrode 352 of FIG. 3, a first electrode 451 and a second electrode 452 of FIG. 4, or a first electrode 551 and a second electrode 552 of FIG. 5. FIGS. 3 through 5 schematically show each of these electrodes as dots. Structurally, each of these electrodes can include a conductive material. Respective ones of the memory elements 333, 444, 555 can include a material that can be changed, for example, in response to a signal, to have different resistance values. The value of information stored in the memory element can correspond to the resistance value of the memory element. The access components 311, 411, 511 can enable signals to be transferred to and from the memory elements 333, 444, 555 via the respective pairs of electrodes during operation of the memory cells such as read, program, or erase operations.

For memory cells 301, 401, or 501 realized as a resistive random access memory (RRAM) cell, electrodes 351 and 352, electrodes 451 and 452, electrodes 551 and 552 can be two electrodes of the RRAM cell with an operably variable resistance region between the two electrodes. Memory elements 333, 444, 555 can be realized as the operably variable resistance region. An oxide can be structured as the operably variable resistance region between the two electrodes. The oxide can include one or more of zirconium oxide, hafnium oxide, or titanium oxide. The oxide can include an oxygen gradient along an ion implantation region between the two electrodes. The ion implantation region can be disposed in the oxide within a distance of about 10% of the thickness of the oxide from one of the two electrodes. Memory cells 301, 401, or 501 structured a resistive random access memory cells can include a buffer region between the respective oxide 333, 444, or 555 and one of the two corresponding electrodes 351 and 352, 451 and 452, or 551 and 552, respectively. In various embodiments, at least one of the two corresponding electrodes 351 and 352, 451 and 452, or 551 and 552, can include a material that is reactive with the oxide.

A programming operation may use signal WL to turn on the access components 311, 411, 511, and then apply a signal, for example a signal having a programming voltage or current, through the memory elements 333, 444, 555. Such a signal can cause at least a portion of the material of the memory elements 333, 444, 555 to change. The change can be reversed by, for instance, performing an erase operation. The differences in resistance values can be used to represent different states that represent different values of the information that is stored in the memory elements 333, 444, 555.

A read operation may use the signal WL to turn on access components 311, 411, or 511, and then apply a signal having a voltage or a current through the memory elements 333, 444, 555. The read operation may measure the resistance of the memory cells 301, 401, 501, based on a read voltage or current, to determine the corresponding value of information stored therein. For example, in each of memory cells 301, 401, 501, a different resistance value can impart a different value (e.g., voltage or current value) to signal BL when a read current passes through the memory elements 333, 444, 555. Other circuitry of the memory device, for example a circuit such as I/O circuit 116 of FIG. 1, can use the signal BL to measure the resistance value of memory elements 333, 444, 555 to determine the value of the information stored therein.

In a read operation, the value (e.g., the voltage) of the signal (e.g., the signal BL in FIG. 3 or FIG. 4 or the signal WL in FIG. 5) that creates a current flowing through the memory element can be sufficient to create the current but insufficient to cause any portion of the memory element to change. Consequently, the value of the information stored in the memory element can remain unchanged during and after the read operation.

In an erase operation, the voltage value of the signal (e.g., the signal BL in FIG. 3 or FIG. 4 or the signal WL in FIG. 5) can have an opposite polarity from the voltage used in a programming operation. The signal, creating a current in this case, can therefore change, or reset, the material of the memory element to its original state; for example, a state prior to any programming being performed on the memory cells.

In various embodiments, oxygen can be incorporated into a resistive random access memory (RRAM) cell via ion implantation. Ion implantation processes can provide precise control of the concentration and depth of oxygen implanted into the cells. Such a process can also be used to compensate for oxygen loss from the RRAM cell during processing steps. Binary oxides can be operated as variable resistance material using variations in oxygen vacancy concentrations. A low temperature anneal can be used to activate the oxygen into the vacancies. A low temperature anneal can include annealing at about 500° C. or at temperatures below 500° C.

Figure 6:
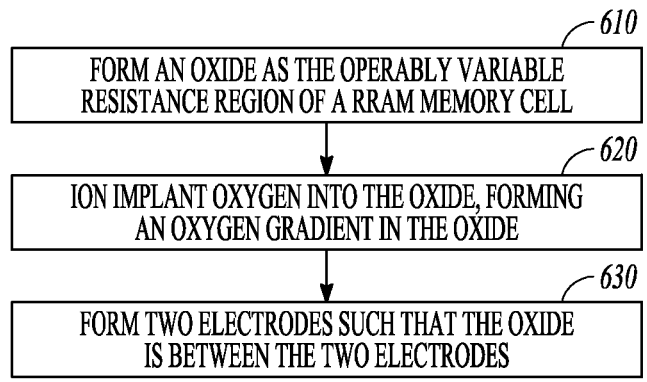
FIG. 6 shows features of an example method of forming an apparatus having a memory cell, in accordance with various embodiments.

FIG. 6 shows features of an embodiment of a method of forming an apparatus having a memory cell. The method includes forming a resistive random access memory cell having an operably variable resistance region. At 610, an oxide is formed as the operably variable resistance region. Forming the oxide can include forming one or more of zirconium oxide, hafnium oxide, or titanium oxide. Other oxides may be used as the operably variable resistance region in the RRAM formed.

At 620, oxygen is ion implanted into the oxide, forming an oxygen gradient in the oxide. Ion implanting oxygen can include performing oxygen implantation at an energy that ranges from about 200 eV to about 5 KeV with a conventional ion implantation method. If a plasma-based implant (or plasma immersion implant) is used, ion implanting energy can be an energy range from about 0 KeV to about 5 KeV. Ion implanting oxygen can include implanting oxygen at an energy and a dose to form the oxygen gradient according to a selected gradient. Forming the oxygen gradient in the oxide can include implanting oxygen such that the oxygen gradient is substantially constant from a top surface of the oxide to a location in the oxide less than a thickness of the oxide. Forming the RRAM can include using a mask to implant the oxygen such that the oxygen implantation occurs in a portion of the oxide less than the width of the oxide along the electrodes arranged substantially parallel to each other.

At 630, two electrodes are formed such that the oxide is between the two electrodes. Forming the two electrodes can include forming the two electrodes as a top electrode and a bottom electrode, where the bottom electrode is formed on a bottom metal pad such that the oxide is formed on the bottom electrode. Forming the bottom electrode can include forming the bottom electrode such in a dielectric region between the bottom metal pad and the oxide. Forming the bottom electrode in the dielectric region can include forming the bottom electrode disposed in a silicon nitride region.

Figure 7:
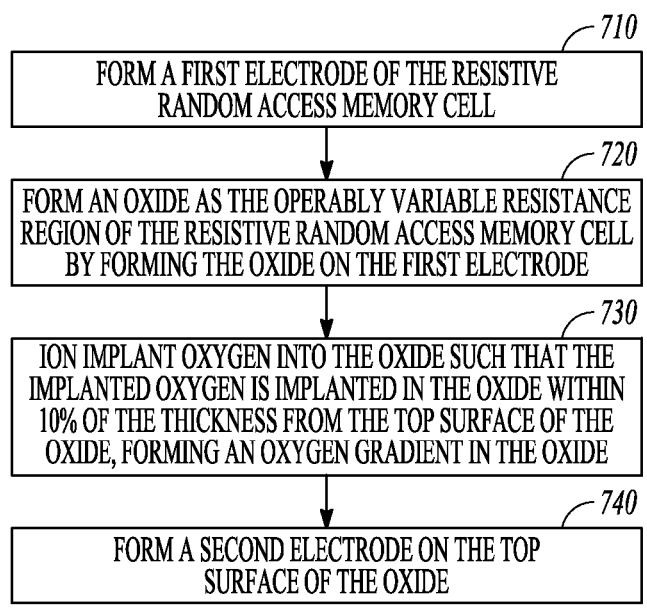
FIG. 7 shows features of an example method of forming an apparatus having a memory cell, in accordance with various embodiments.

FIG. 7 shows features of an embodiment of a method of forming an apparatus having a memory cell. The method includes forming a resistive random access memory cell having an operably variable resistance region. At 710, a first electrode of the resistive random access memory cell is formed. At 720, the operably variable resistance region of the resistive random access memory cell is formed by forming an oxide on the first electrode. The formed oxide has a thickness between a top surface of the oxide and a bottom surface of the oxide. Forming the oxide can include forming an oxide having a thickness ranging from about 0 Å to about 500 Å. Forming the oxide can include forming one or more of zirconium oxide, hafnium oxide, or titanium oxide.

At 730, oxygen is ion implanted into the oxide such that the implanted oxygen is implanted in the oxide within about 10% of the thickness from the top surface, forming an oxygen gradient in the oxide. Ion implanting oxygen can include performing molecular beam implantation to implant oxygen molecules. Ion implanting oxygen can include using a plasma-based implantation or a plasma immersion implantation. At 740, a second electrode is formed on the top surface of the oxide.

Figure 8:
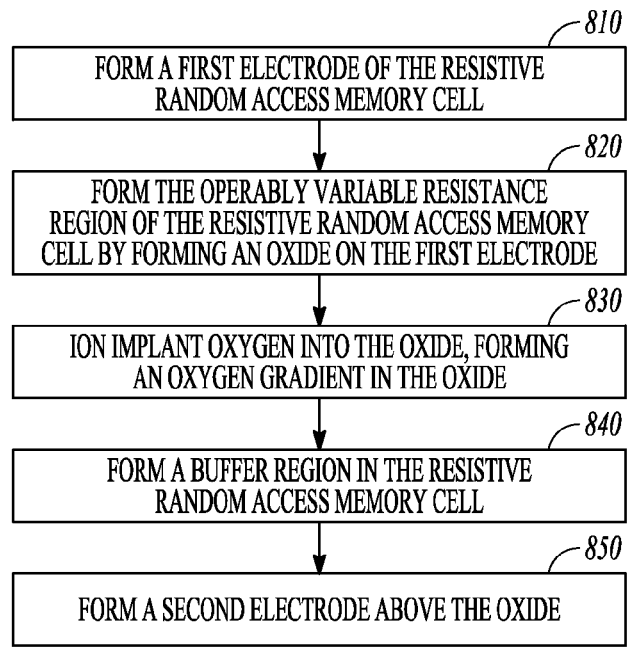
FIG. 8 shows features of an example method of forming an apparatus having a memory cell, in accordance with various embodiments.

FIG. 8 shows features of an embodiment of a method of forming an apparatus having a memory cell. The method includes forming a resistive random access memory cell having an operably variable resistance region. At 810, a first electrode of the resistive random access memory cell is formed. At 820, the operably variable resistance region of the resistive random access memory cell is formed by forming an oxide on the first electrode. Forming the oxide can include forming one or more of zirconium oxide, hafnium oxide, or titanium oxide.

At 830, oxygen is ion implanted into the oxide, forming an oxygen gradient in the oxide. At 840, a buffer region in the resistive random access memory cell is formed. Forming the buffer region can include forming the buffer region between the oxide and the first electrode. Forming the buffer region can include forming the buffer region between the oxide and the second electrode. At 850, a second electrode is formed above the top surface of the oxide.

Figure 9:
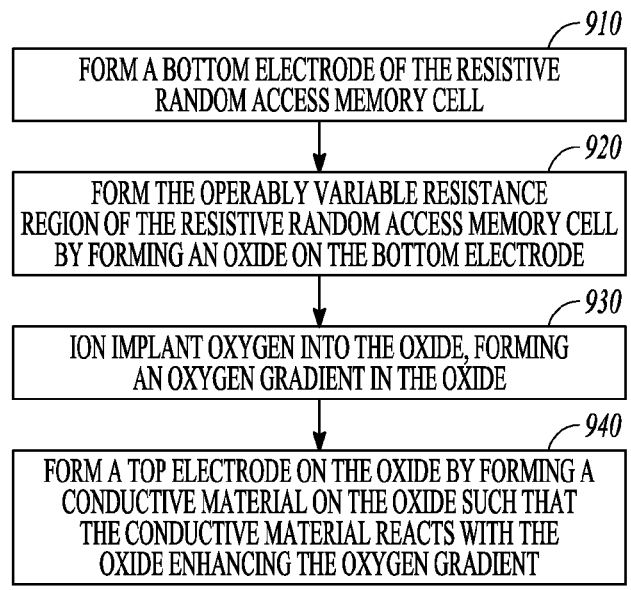
FIG. 9 shows features of an example method of forming an apparatus having a memory cell, in accordance with various embodiments.

FIG. 9 shows features of an embodiment of a method of forming an apparatus having a memory cell. The method includes forming a resistive random access memory cell having an operably variable resistance region. At 910, a bottom electrode of the resistive random access memory cell is formed. At 920, the operably variable resistance region of the resistive random access memory cell is formed by forming an oxide on the bottom electrode. Forming the oxide can include forming one or more of zirconium oxide, hafnium oxide, or titanium oxide. At 930, oxygen is ion implanted into the oxide, forming an oxygen gradient in the oxide.

At 940, a top electrode on the oxide is formed by forming a conductive material on the oxide such that the conductive material reacts with the oxide, enhancing the oxygen gradient. Enhancing the oxygen gradient can include, for example, adding additional oxygen, making the gradient steeper, or providing more variability to the gradient. Forming the top electrode can include forming titanium nitride. Forming the oxide, the bottom electrode, and the top electrode can include forming the oxide, the bottom electrode, and the top electrode such that the bottom and top electrodes are aligned substantially vertically in line with each other, the bottom electrode having a first width and the top electrode having a second width, the oxide having a width larger that the first width and larger than the second width, the oxide disposed on a top surface of the bottom electrode and horizontally from both ends of the top surface, the oxide disposed below a bottom surface of the top electrode and horizontally from both ends of the bottom surface.

Figure 10A:
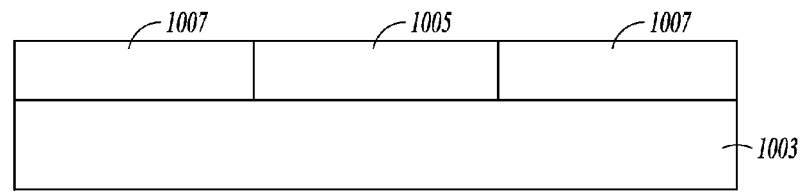
FIGS. 10A-10F show examples of various processing stages in fabricating an apparatus having a resistive random access memory, in accordance with various embodiments.

FIGS. 10A-10F show embodiments of various processing stages in fabricating an apparatus having a resistive random access memory. FIG. 10A shows a result of a processing stage in fabricating an apparatus having a resistive random access memory. This result includes a metal pad 1003 with an electrode 1005 and a dielectric region 1007 disposed on metal pad 1003, where electrode 1005 is within dielectric region 1007 for a memory cell of the RRAM. This structure can be obtained by forming dielectric region 1007 on metal pad 1003, removing a portion of dielectric region 1007 exposing a region of the surface of metal pad 1003, and filling the removed portion with material that forms electrode 1005. Removing material can be conducted using conventional techniques for removing material in selected regions of an electronic device. Alternatively, this structure can be obtained by forming electrode 1005 on metal pad 1003 using a mask and then forming dielectric region 1007 around electrode 1005. Metal pad 1003 can be formed of a conductive material such as, but not limited to, copper or aluminum using appropriate deposition processes, such as, but not limited to, chemical vapor deposition, evaporation, sputtering, molecular beam epitaxy, atomic layer deposition, or other appropriate fabrication techniques. Electrode 1005 can be formed of a conductive material such as, but not limited to, platinum using appropriate deposition processes, such as, but not limited to, chemical vapor deposition, evaporation, sputtering, molecular beam epitaxy, atomic layer deposition, or other appropriate fabrication techniques. Dielectric region 1007 can be formed of a dielectric material such as, but not limited to, silicon nitride using appropriate deposition processes, such as, but not limited to, chemical vapor deposition, evaporation, sputtering, molecular beam epitaxy, atomic layer deposition, or other appropriate fabrication techniques.

Figure 10B:
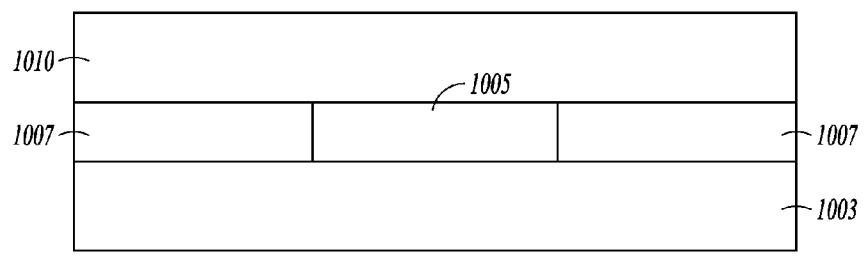

FIG. 10B shows a result of processing stage in fabricating an apparatus having a resistive random access memory. This result includes an oxide 1010 formed on electrode 1005 and dielectric region 1007 of FIG. 10A. Oxide 1010 can be formed as the operably variable resistance region of the RRAM. Oxide 1010 can be formed of a dielectric material such as, but not limited to, hafnium oxide, zirconium oxide, titanium oxide, or combinations thereof using appropriate deposition processes, such as, but not limited to, chemical vapor deposition, evaporation, sputtering, molecular beam epitaxy, atomic layer deposition, or other appropriate fabrication techniques. Oxide 1010 can be formed with a thickness ranging from about 50 Å to about 500 Å. An oxide of other thicknesses can be formed.

Figure 10C:
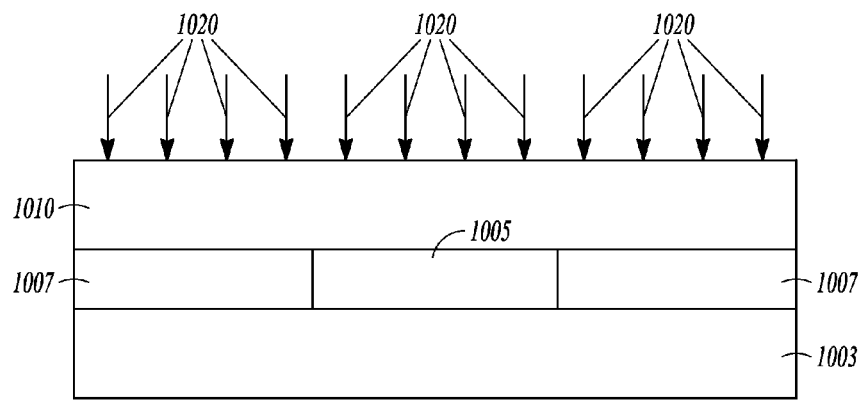

FIG. 10C shows a processing stage in fabricating an apparatus having a resistive random access memory. In this processing stage, oxygen can be incorporated into oxide 1010 by ion implanting. Incorporation of oxygen into oxide 1010 by ion implanting can form an oxygen gradient in oxide 1010. Ion implanting oxygen can include implanting oxygen at an energy and a dose to form the oxygen gradient according to a selected gradient.

The oxygen gradient can be formed as a continuously varying concentration of oxygen or as a step-wise variation. The oxygen gradient in oxide 1010, based on implanting oxygen, can be structured to be substantially constant from a top surface of oxide 1010 to a location in oxide 1010 less than a thickness of oxide 1010. Oxygen can be incorporated in oxide 1010 by ion implanting oxygen such that the implanted oxygen is implanted in oxide 1010 within about 10% of the thickness from the top surface of oxide 1010. Oxygen can be implanted into oxide 1010 to depths greater than 10% of the thickness from the top surface of oxide 1010. Ion implantation can be conducted at implantation energies ranging from about 200 eV to about 5 KeV with a conventional beamline implantation method or about 0 KeV to about 5 KeV with a plasma-based implantation method.

Oxygen implant to tailor oxygen content in oxide 1010 can be conducted by directing the oxygen implant into oxide 1010 over a horizontal range of the top surface of oxide 1010 extending beyond horizontal regions corresponding to electrode 1005. Alternatively, oxygen implantation to tailor oxygen content in oxide 1010 can be conducted by directing the oxygen implant into oxide 1010 over a horizontal range of the top surface of oxide 1010 corresponding to vertical alignment with electrode 1005.

Figure 10D:
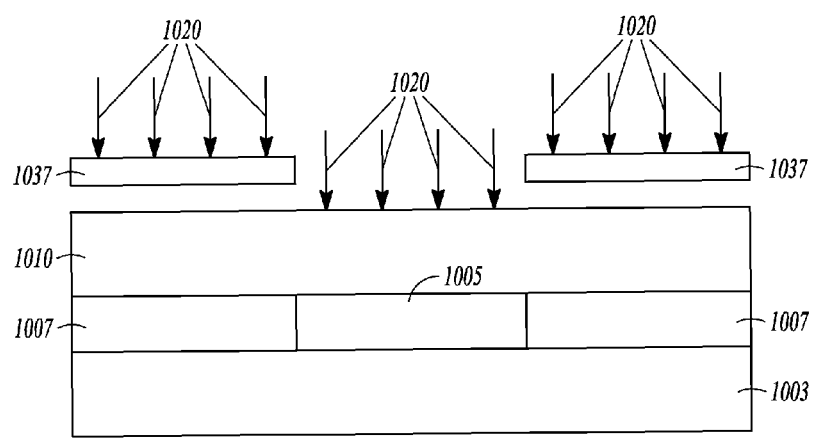

FIG. 10D shows oxygen implanted to tailor oxygen content in oxide 1010 confined to a region of oxide 1010 vertically aligned with electrode 1005. The oxygen implant to the region less than the top surface of oxide 1010 can be conducted using a masking structure 1037. Mask 1037 can be used to implant the oxygen such that the oxygen implantation occurs in a portion of the oxide 1010 less than a width of the oxide 1010 along electrode 1005 arranged substantially parallel to electrode 1015, shown in FIG. 10E to be deposited. Alternatively, the oxygen implant to the region less than the top surface of oxide 1010 can be conducted by using a focusing mechanism of the implant system for directing the ion implantation process.

Figure 10E:
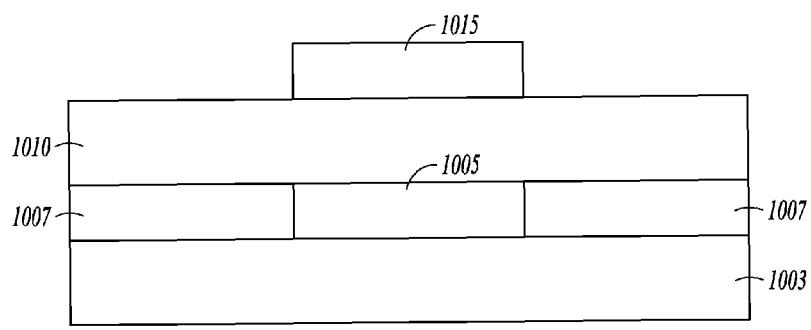

FIG. 10E shows a result of a processing stage in fabricating an apparatus having a resistive random access memory. This result includes an electrode 1015 disposed on oxide 1010 incorporated with oxygen as shown in FIG. 10C or FIG. 10D for a memory cell of the RRAM. This structure can be obtained by forming a conductive material on oxide 1010 and removing portions of the conductive material to form electrode 1015 in a desired position with respect to electrode 1015. Removing material can be conducted using conventional techniques for removing material in selected regions of an electronic device. Conventional techniques can be used to structure electrode 1015. Alternatively, this structure can be obtained by forming electrode 1015 on oxide 1010 using a mask and then removing the mask. Conventional techniques can be used to structure electrode 1015 using a mask. Electrode 1015 can be formed of a conductive material such as, but not limited to, titanium nitride using appropriate deposition processes, such as, but not limited to, chemical vapor deposition, evaporation, sputtering, molecular beam epitaxy, atomic layer deposition, or other appropriate fabrication techniques. The conductive material for electrode 1015 on oxide 1010 can be selected such that the conductive material reacts with oxide 1010 enhancing the oxygen gradient.

Figure 10F:
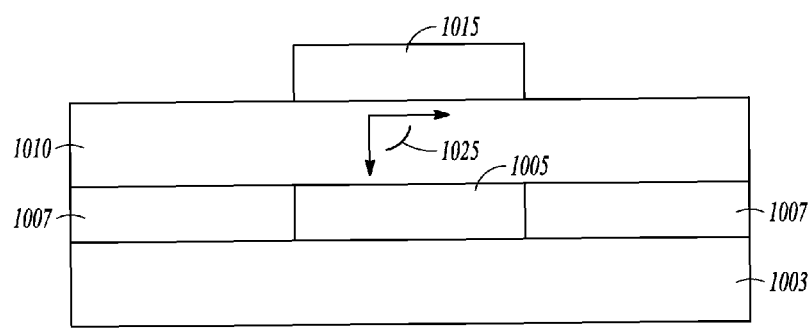

FIG. 10F shows a RRAM cell, from the processing depicted in FIGS. 10A-E, which includes two electrodes 1005 and 1015 with oxide 1010 between the two electrodes 1005 and 1015, where oxide 1010 is structured as the operably variable resistance of the RRAM using an oxygen gradient 1025 along an ion implantation region in oxide 1010 between the two electrodes 1005 and 1015. Oxide 1010, electrode 1005, and electrode 1015 can be formed such that electrodes 1005 and 1015 are aligned vertically in line with each other. Electrode 1005 has a first width and electrode 1015 has a second width. Oxide 1010 can be formed having a width larger that the first width and larger than the second width. Oxide 1010 can be disposed on a top surface of electrode 1005 and horizontally from both ends of the top surface and disposed below a bottom surface of electrode 1015 and horizontally from both ends of the bottom surface.

Figure 11A:
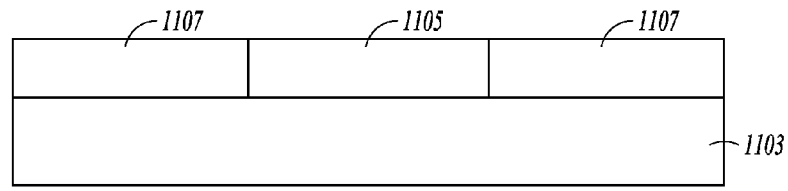
FIGS. 11A-11Q show examples of various processing stages that can be performed in fabricating an apparatus having a resistive random access memory, in accordance with various embodiments.
Figure 11B:
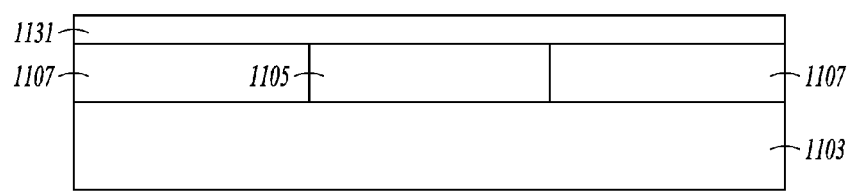
Figure 11C:
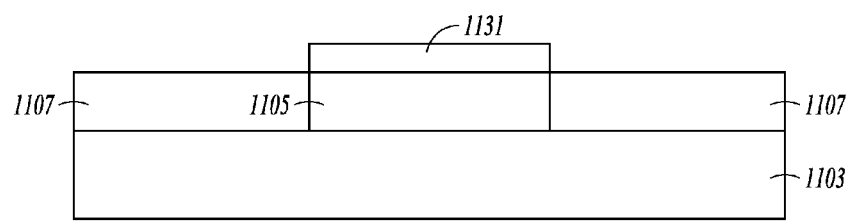
Figure 11D:
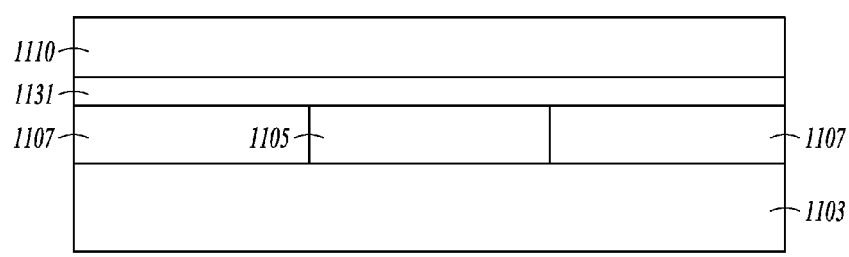
Figure 11E:
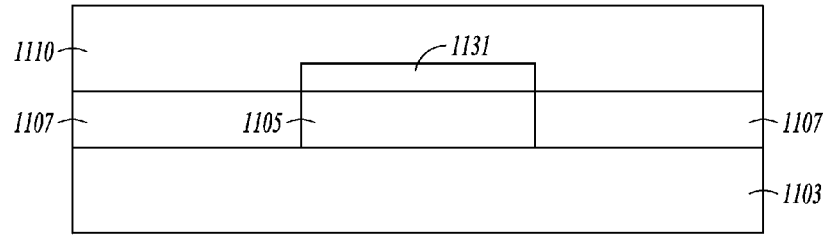
Figure 11F:
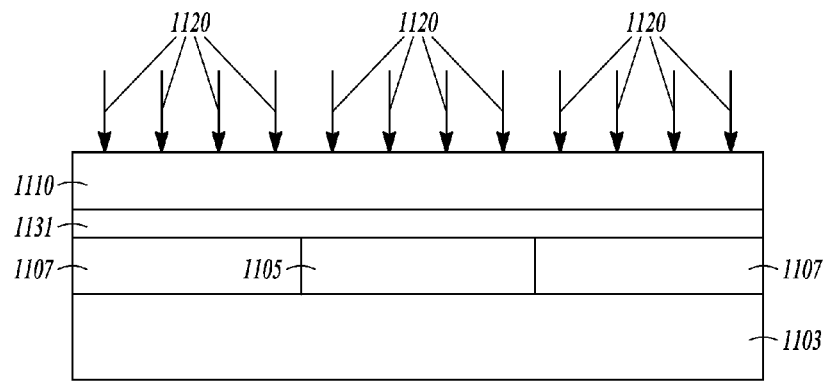
Figure 11G:
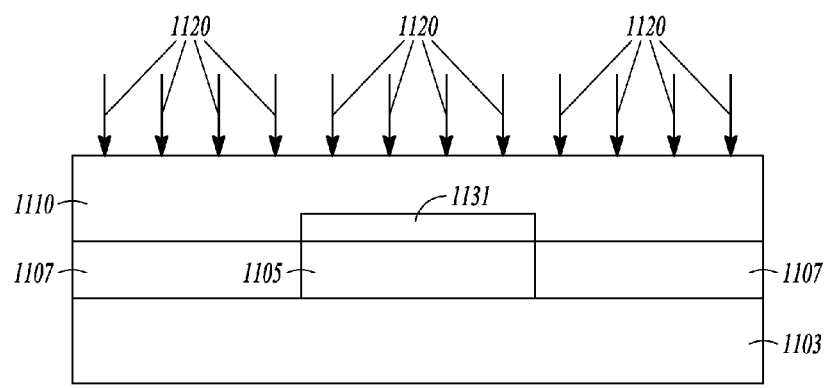
Figure 11H:
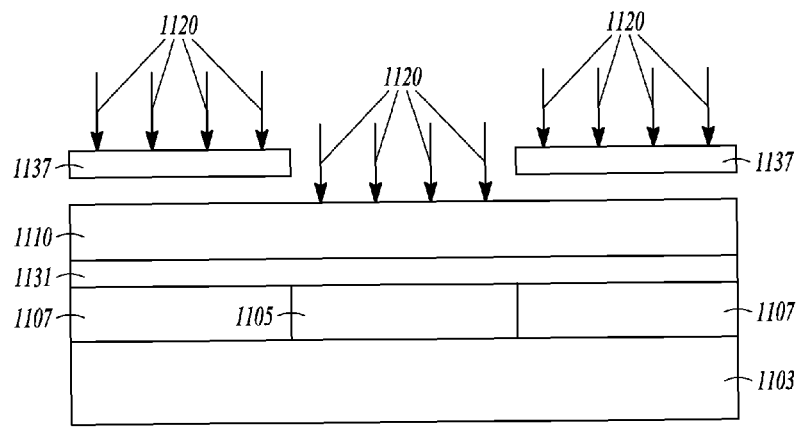
Figure 11I:
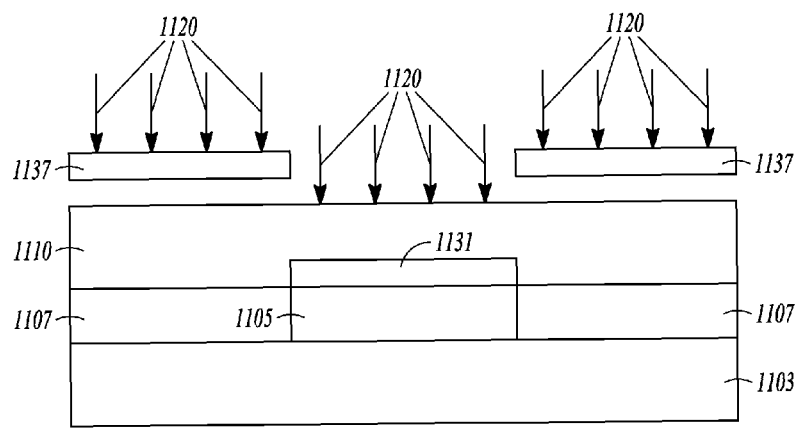
Figure 11J:
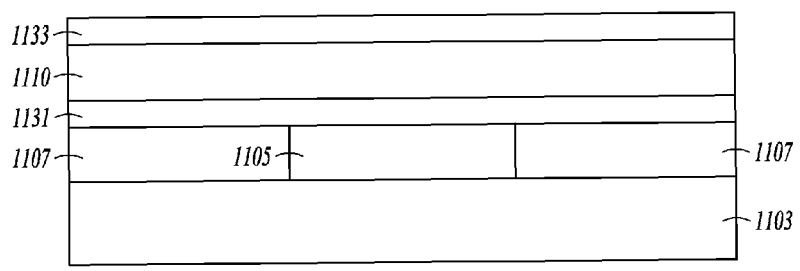
Figure 11K:
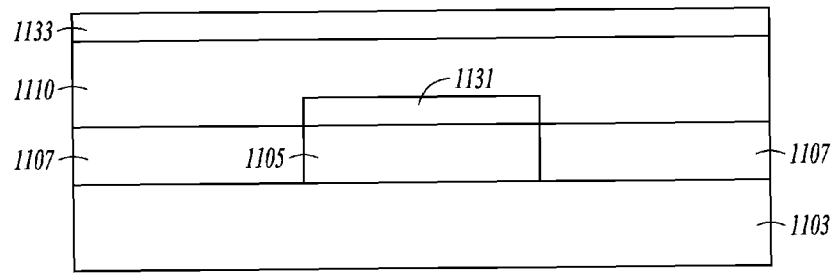
Figure 11L:
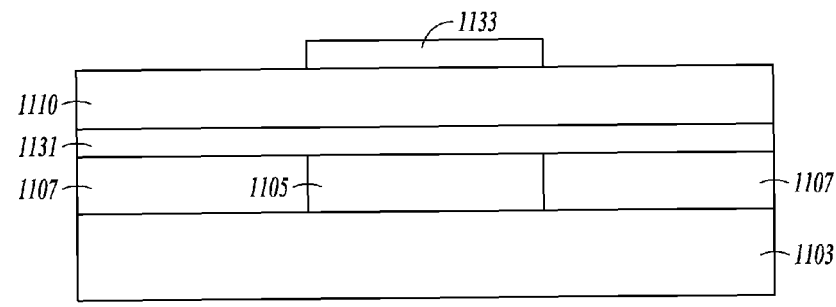
Figure 11M:
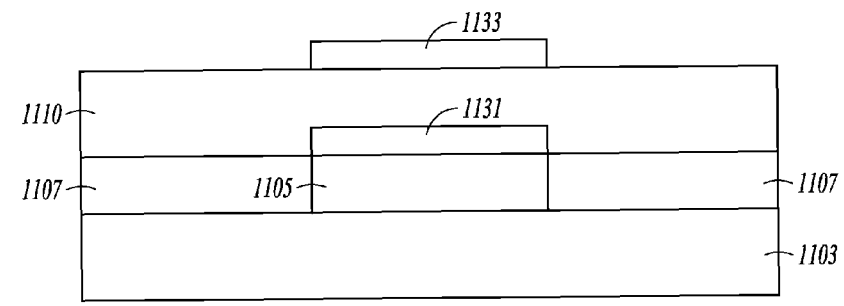
Figure 11N:
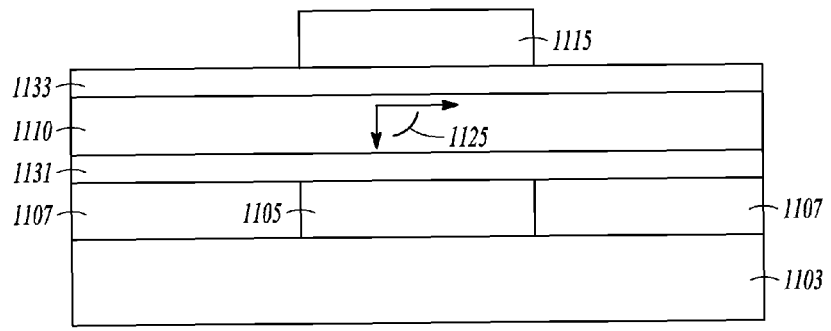
Figure 11O:
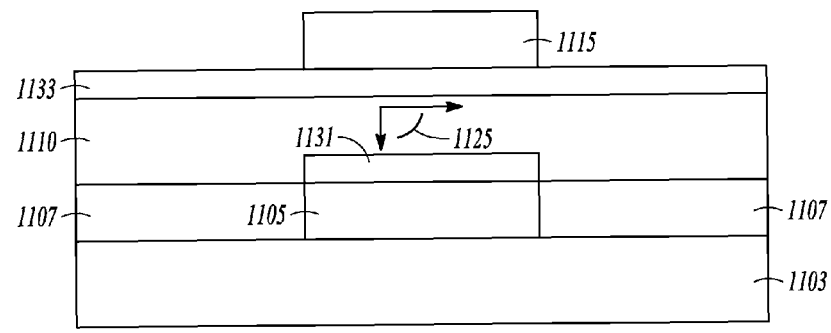
Figure 11P:
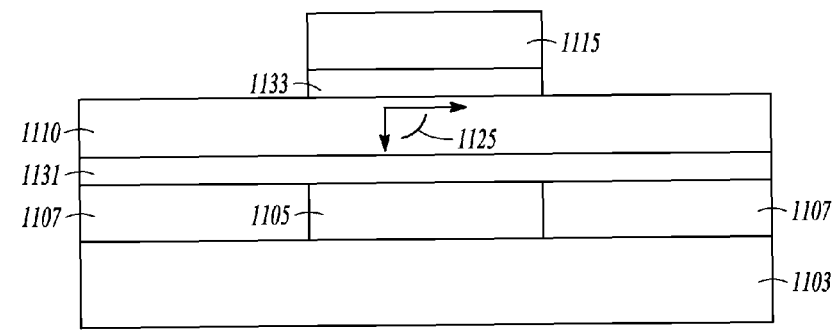
Figure 11Q:
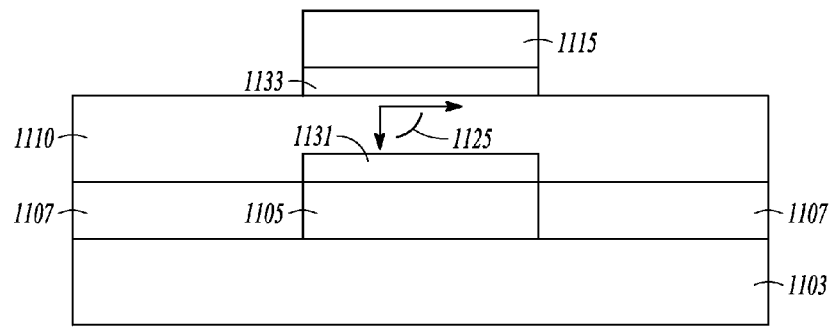

FIGS. 11A-11Q show embodiments of various processing stages that can be performed in fabricating an apparatus having a resistive random access memory. These processing stages can be similar to processing activities discussed herein, for example, the processing stages of FIGS. 10A-F, modified to include forming one or more buffers. FIG. 11A shows a result of a processing stage in fabricating an apparatus having a resistive random access memory. This result includes a metal pad 1103 with an electrode 1105 and a dielectric region 1107 disposed on metal pad 1103, where electrode 1105 is within dielectric region 1107 for a memory cell of the RRAM. This structure can be attained by forming dielectric region 1107 on metal pad 1103, removing a portion of dielectric region 1107 exposing a region of the surface of metal pad 1103, and filling the removed portion with material that forms electrode 1105. Removing material can be conducted using conventional techniques for removing material in selected regions of an electronic device. Alternatively, this structure can be attained by forming electrode 1105 on metal pad 1103 using a mask and then forming dielectric region 1107 around electrode 1105. Metal pad 1103 can be formed of a conductive material such as, but not limited to, copper or aluminum using appropriate deposition processes, such as, but not limited to, chemical vapor deposition, evaporation, sputtering, molecular beam epitaxy, atomic layer deposition, or other appropriate fabrication techniques. Electrode 1105 can be formed of a conductive material such as, but not limited to, platinum using appropriate deposition processes, such as, but not limited to, chemical vapor deposition, evaporation, sputtering, molecular beam epitaxy, atomic layer deposition, or other appropriate fabrication techniques. Dielectric region 1107 can be formed of a dielectric material such as, but not limited to, silicon nitride using appropriate deposition processes, such as, but not limited to, chemical vapor deposition, evaporation, sputtering, molecular beam epitaxy, atomic layer deposition, or other appropriate fabrication techniques.

FIG. 11B shows a result of a processing stage in fabricating an apparatus having a resistive random access memory with a buffer. This result includes a material 1131 formed on dielectric region 1107 and electrode 1105. Material 1131 can be used as a buffer in the RRAM cell being formed. Material 1131 can cover the surfaces of dielectric region 1107 and electrode 1105. Material 1131 may cover less than the complete surfaces of dielectric region 1107 and electrode 1105. Buffer 1131 can be formed using appropriate deposition processes, such as, but not limited to, chemical vapor deposition, evaporation, sputtering, molecular beam epitaxy, atomic layer deposition, or other appropriate fabrication techniques.

FIG. 11C shows an alternative structure for an arrangement of dielectric region 1107 and electrode 1105 with respect to buffer 1131. In this alternative structure, portions of buffer 1131 of FIG. 11B can be removed leaving buffer 1131 to correspond to a region substantially aligned with electrode 1105 on metal pad 1103. Buffer 1131 can be formed in a manner similar to the formation as discussed above with respect to FIG. 11B, relative to the combination of metal pad 1103 and dielectric region 1107. Buffer 1131 is not limited to alignment with electrode 1105, but may extend horizontally beyond the horizontal ends of electrode 1105. In another approach, from FIGS. 11B and 11C, it can be seen that dielectric region 1107 can be formed on metal pad 1103, a portion of dielectric region 1107 can be removed exposing a region of the surface of metal pad 1103, the removed portion can be filled with material that forms electrode 1105 followed by material that forms buffer 1131, and portions of dielectric region 1107 can be removed such that the top surface of electrode 1107 is substantially level with the top surface of dielectric region 1107. Removing material can be conducted using conventional techniques for removing material in selected regions of an electronic device. However, electrode 1105 may protrude above the top surface of dielectric region 1107 with buffer 1131 disposed on electrode 1105.

FIG. 11D shows a result of processing stage in fabricating an apparatus having a resistive random access memory with a buffer. This result includes an oxide 1110 formed on buffer 1131 of FIG. 11B. FIG. 11E shows a result of processing stage that includes oxide 1110 formed on buffer 1131 of the structure of FIG. 11C. Oxide 1110 can be formed as the operably variable resistance region of the RRAM. Oxide 1110 can be formed of a dielectric material such as, but not limited to, hafnium oxide, zirconium oxide, titanium oxide, or combinations thereof using appropriate deposition processes, such as, but not limited to, chemical vapor deposition, evaporation, sputtering, molecular beam epitaxy, atomic layer deposition, or other appropriate fabrication techniques. Oxide 1110 can be formed with a thickness ranging from about 50 Å to about 500 Å. An oxide of other thicknesses can be formed.

FIG. 11F shows a processing stage in fabricating an apparatus having a resistive random access memory with a buffer. In this processing stage, oxygen can be incorporated by ion implanting into oxide 1110 of FIG. 11D. FIG. 11G shows oxygen incorporated by ion implanting into oxide 1110 of FIG. 11E. Incorporation of oxygen into oxide 1110 by ion implanting can form an oxygen gradient in oxide 1110. Ion implanting oxygen can include implanting oxygen at an energy and a dose to form the oxygen gradient according to a selected gradient. The oxygen gradient can be formed as a continuously varying concentration of oxygen or as a stepwise variation. The oxygen gradient in oxide 1110 generated from implanting oxygen can be structured to be essentially constant from a top surface of oxide 1110 to a location in oxide 1110 less than a thickness of oxide 1110. Oxygen can be incorporated in oxide 1110 by ion implanting oxygen such that the implanted oxygen is implanted in oxide 1110 within about 10% of the thickness from the top surface of oxide 1110. Oxygen can be implanted into oxide 1110 to depths greater than 10% of the thickness from the top surface of oxide 1110. Ion implantation can be conducted at implantation energies ranging from about 200 eV to about 5 KeV with a conventional beamline implantation method or about 0 KeV to about 5 KeV with a plasma-based implantation method.

Oxygen implanted to tailor oxygen content in oxide 1110 can be conducted by directing the oxygen implanted into oxide 1110 over a horizontal range of the top surface of oxide 1110 extending beyond horizontal regions corresponding to electrode 1105. Alternatively, oxygen implanted to tailor oxygen content in oxide 1110 can be conducted by directing the oxygen implanted into oxide 1110 over a horizontal range of the top surface of oxide 1110 corresponding to vertical alignment with electrode 1105. FIG. 11H and FIG. 11I show oxygen implanted to tailor oxygen content in oxide 1110 confined to a region of oxide 1110 substantially vertically aligned with electrode 1105 in the structures of FIG. 11D and FIG. 11E, respectively. The oxygen implanted to the region less than the top surface of oxide 1110 can be conducted using a masking structure 1137. Mask 1137 can be used to implant the oxygen such that the oxygen implantation occurs in a portion of the oxide 1110 less than a width of the oxide 1110 along electrode 1105 arranged to be substantially parallel to a second electrode to be deposited (for example electrode 1115, shown in FIGS. 11N, 11O, 11P, and 11Q). Alternatively, the oxygen implanted to the region less than the top surface of oxide 1110 can be conducted by using a focusing mechanism of the implant system for directing the ion implantation process.

FIGS. 11J-11M shows results of various different processing stages in fabricating an apparatus having a resistive random access memory with a buffer. FIG. 11J shows a buffer 1133 formed on oxide 1110 across the surface of oxide 1110 of the structure of FIG. 11D. FIG. 11K shows a buffer 1133 formed on oxide 1110 across the surface of oxide 1110 of the structure of FIG. 11E. Buffer 1133 can be formed using appropriate deposition processes, such as, but not limited to, chemical vapor deposition, evaporation, sputtering, molecular beam epitaxy, atomic layer deposition, or other appropriate fabrication techniques. Buffer 1133 can be formed such that buffer 1133 corresponds to a region substantially aligned with electrode 1115 to be formed (for example, in FIGS. 11N-11Q) on oxide 1110 with buffer 1133 between oxide 1110 and electrode 1115. FIG. 11L shows buffer 1133 formed on oxide 1110 confined to a portion of the surface of oxide 1110 of the structure of FIG. 11D. FIG. 11M shows buffer 1133 formed on oxide 1110 confined to a portion of the surface of oxide 1110 of the structure of FIG. 11E. Buffer 1133 in the structures of FIGS. 11L and 11M can be formed in a manner similar to or identical to forming buffer 1133 in the structures of FIGS. 11J and 11K, followed by removing one or more portions of buffer 1133. Removing one or more portions of buffer 1133 can be conducted using conventional techniques for removing material in selected regions of an electronic device. Alternatively, buffer 1133 can be structured as in FIGS. 11L and 11M during the formation of a second electrode for the RRAM.

FIGS. 11N-11Q shows results of various processing stages in fabricating an apparatus having a resistive random access memory with a buffer. FIG. 11N shows an electrode 1115 formed on buffer 1133 of the structure of FIG. 11J. FIG. 11O shows an electrode 1115 formed on buffer 1133 of the structure of FIG. 11K. Electrode 1115 of the structures shown in FIGS. 11N and 11O can be structured by forming a conductive material on buffer 1133 and removing portions of the conductive material to form electrode 1115 in a desired position with respect to electrode 1105. Removing material can be conducted using conventional techniques for removing material in selected regions of an electronic device. Conventional techniques can be used to structure electrode 1115. Alternatively, this structure can be obtained by forming electrode 1115 on buffer 1133 using a mask and then removing the mask. Conventional techniques can be used to structure electrode 1115 using a mask.

FIG. 11P shows an electrode 1115 formed on buffer 1133 of the structure of FIG. 11L. FIG. 11Q shows an electrode 1115 formed on buffer 1133 of the structure of FIG. 11M. Electrode 1115 of FIGS. 11P and 11Q can be structured by forming a conductive material on buffer 1133 and oxide 1110, followed by removing portions of the conductive material to form electrode 1115 in a desired position with respect to electrode 1105. Removing material can be conducted using conventional techniques for removing material in selected regions of an electronic device. Conventional techniques can be used to structure electrode 1115. Alternatively, this structure can be obtained by forming electrode 1115 on buffer 1133 using a mask and then removing the mask. Conventional techniques can be used to structure electrode 1115 using a mask. In another approach, conductive material can be formed on a region of buffer material formed on oxide 1110 and across the region of buffer material, where the buffer material is formed as shown in FIGS. 11J and 11K. Then, portions of both the conductive material and the region of buffer can be removed, leaving the structures shown in FIGS. 11P and 11Q. Removing multiple different compositions of material can be conducted using conventional techniques for removing such material in selected regions of an electronic device. Electrode 1115 can be formed of a conductive material such as, but not limited to, titanium nitride using appropriate deposition processes, such as, but not limited to, chemical vapor deposition, evaporation, sputtering, molecular beam epitaxy, atomic layer deposition, or other appropriate fabrication techniques.

FIGS. 11N-11Q show features of a resistive random access memory of an apparatus. The resistive random access memory cells shown in FIGS. 11N-Q includes two electrodes 1105 and 1115 with oxide 1110 between the two electrodes 1105 and 1115, including buffers 1131 and 1133. Buffers 1131 and 1133 may be optional such that the RRAM cell can be formed with one or more of the buffers or without a buffer. Oxide 1110 can be structured as the operably variable resistance of the RRAM using an oxygen gradient 1125 along an ion implantation region in oxide 1110 between the two electrodes 1105 and 1115. Oxide 1110, electrode 1105, and electrode 1115 can be formed such that electrodes 1105 and 1115 are substantially aligned vertically in line with each other. Electrode 1105 has a first width and electrode 1115 has a second width. Oxide 1110 can be formed having a width larger that the first width and larger than the second width. Oxide 1110 can be disposed on a top surface of electrode 1105 and horizontally from both ends of the top surface and the disposed below a bottom surface of electrode 1115 and horizontally from both ends of the bottom surface.

In the features of processing stages shown in FIGS. 10A-10F and FIGS. 11A-11Q, features of an apparatus having a RRAM have been omitted for ease of discussion. The discussions related to forming the memory element of a single RRAM cell and its corresponding electrodes. These techniques may be applied to other memory cells of the RRAM. In addition, additional electrically insulating material that can be formed as part of the memory cell and electrical paths for accessing the memory element of the RRAM cell can be fabricated using conventional techniques. Further, formation of the regions discussed in FIGS. 10A-10F and FIGS. 11A-11Q may be realized in other sequences and by techniques for forming electronic devices having stacks of materials that include conductive material and dielectric material, in which such sequencing of material regions and techniques may use procedures known to those of ordinary skill in the art.

In various embodiments, incorporating oxygen by ion implanting to tailor content in a RRAM can be conducted using different ion implanting processes. In an example, oxygen can be incorporated into about the top 0 nm to about 20 nm of the oxide used as the operably variable resistance of the RRAM. Oxygen can be incorporated into the top about 0 nm to about 100 nm of the oxide. Other distance ranges may be used to provide oxygen incorporation by ion implanting. The ion implanting can be conducted by performing a blanket implant or a mask implant. In a masked implant, an area between the top electrode and bottom electrode of the RRAM cell can be implanted without implanting the entire oxide. In a blanket implant, the area outside the ends of the area between the top electrode and bottom electrode can also be implanted such that the oxide is essentially implanted in the area between the electrodes.

Ion implanting can be performed at energies ranging from about 200 eV to about 5 KeV with a conventional beamline implantation method or about 0 KeV to about 5 KeV with a plasma-based implantation method. The implant energy can be varied along with varying doses to construct an oxygen gradient in an oxide structured as an operably variable resistance of a RRAM. Ion implanting oxygen can include performing molecular beam implantation to implant oxygen molecules. Molecular beam implantation can be performed using a supersonic nozzle to dose a large amount of oxygen in the form of large oxygen molecules or clusters. Ion implanting oxygen can include using a plasma-based implantation. Plasma based species implant may provide exponential or linear profiles in the base materials, such as metal oxides.

Figure 12:
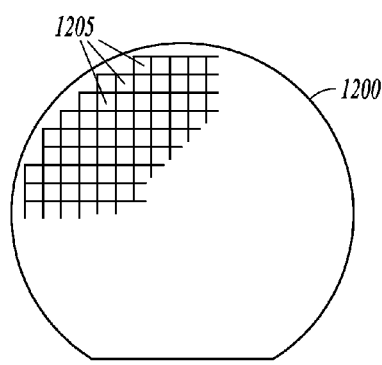
FIG. 12 shows a finished wafer, in accordance with various embodiments.

FIG. 12 illustrates an example of a wafer 1200 arranged to provide multiple electronic components. Wafer 1200 can be provided as a wafer in which a plurality of dice 1205 can be fabricated. Alternatively, wafer 1200 can be provided as a wafer in which the plurality of dice 1205 have been processed to provide electronic functionality and are awaiting singulation from wafer 1200 for packaging. Wafer 1200 can be provided as a semiconductor wafer, a semiconductor on insulator wafer, or other appropriate wafer for processing electronic devices such as an integrated circuit chips. Wafer 1200 can be fabricated in accordance with any embodiment related to FIGS. 1-11.

Using various masking and processing techniques, each die 1205 can be processed to include functional circuitry such that each die 1205 is fabricated as an integrated circuit with the same functionality and packaged structure as the other dice on wafer 1200. Alternatively, using various masking and processing techniques, various sets of dice 1205 can be processed to include functional circuitry such that not all of the dice 1205 are fabricated as an integrated circuit with the same functionality and packaged structure as the other dice on wafer 1200. A packaged die having circuits integrated thereon providing electronic capabilities is herein referred to as an integrated circuit (IC).

Wafer 1200 can include resistive random access memories, where each resistive random access memory is located in a die 1205. Each resistive random access memory can include resistive random access memory cells. Each resistive random access memory cell can include two electrodes with an oxide between the two electrodes. The oxide can be structured as the operably variable resistance of the RRAM using an oxygen gradient along an ion implantation region in the oxide between the two electrodes. One or more buffers may be arranged optionally in the RRAM cell. Performance of such semiconductor based electronic devices can be improved through the enhancement of fabrication processes for RRAM cell structures in accordance with various embodiments as described herein.

Figure 13:
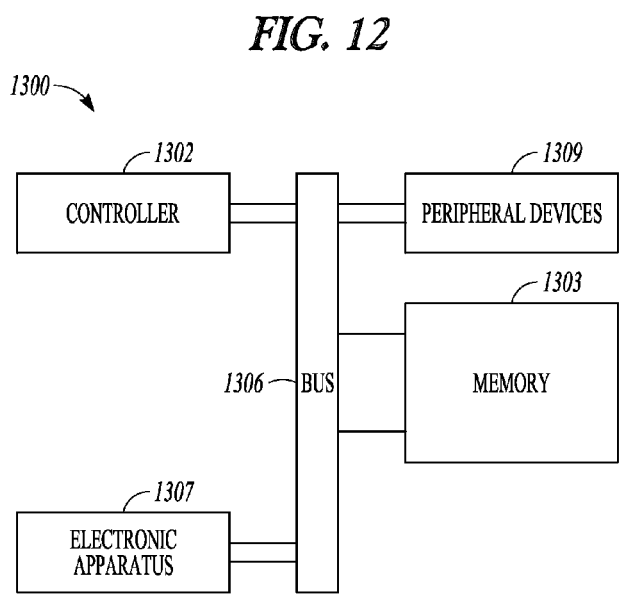
FIG. 13 shows a block diagram of various features of an electronic system, in accordance with various embodiments.

FIG. 13 shows a block diagram of a system 1300 that includes a memory 1303 structured as a resistive random access memory. Each resistive random access memory cell of the RRAM can include two electrodes with an oxide between the two electrodes. The oxide can be structured as the operably variable resistance of the RRAM using an oxygen gradient along an ion implantation region in the oxide between the two electrodes. One or more buffers may be arranged optionally in the RRAM cell. Performance of such semiconductor based electronic devices can be improved through the enhancement of fabrication processes for RRAM cell structures in accordance with various embodiments as discussed herein.

System 1300 can include a controller 1302 operatively coupled to memory 1303. System 1300 can also include an electronic apparatus 1307 and peripheral devices 1309. One or more of controller 1302, memory 1303, electronic apparatus 1307, and peripheral devices 1309 can be in the form of one or more ICs. A bus 1306 provides electrical conductivity between and/or among various components of system 1300. In an embodiment, bus 1306 includes an address bus, a data bus, and a control bus, each independently configured. In an alternative embodiment, bus 1306 uses common conductive lines for providing one or more of address, data, or control, the use of which is regulated by controller 1302. Controller 1302 can be in the form or one or more processors.

Electronic apparatus 1307 may include additional memory. Memory in system 1300 may be constructed as one or more types of memory such as, but not limited to, dynamic random access memory (DRAM), static random access memory (SRAM), synchronous dynamic random access memory (SDRAM), synchronous graphics random access memory (SGRAM), double data rate dynamic ram (DDR), double data rate SDRAM, and magnetic based memory.

Peripheral devices 1309 may include displays, imaging devices, printing devices, wireless devices, additional storage memory, and control devices that may operate in conjunction with controller 1302. In various embodiments, system 1300 includes, but is not limited to, fiber optic systems or devices, electro-optic systems or devices, optical systems or devices, imaging systems or devices, and information handling systems or devices such as wireless systems or devices, telecommunication systems or devices, and computers.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Thus, the following claims are hereby incorporated into the Detailed Description, with each claim standing on its own as a separate embodiment.

What is claimed is:

1. A method comprising:
forming a resistive random access memory cell having an oxide as an operably variable resistance region;
ion implanting oxygen into the oxide to form an oxygen gradient in the oxide; and
forming two electrodes such that the oxide is between the two electrodes, wherein the oxygen gradient is tailored between the two electrodes and is tailored over a horizontal range with respect to one or both of the two electrodes.

2. The method of claim 1, wherein ion implanting oxygen includes performing oxygen implantation at an energy in a range from about 200 eV to about 5 KeV.

3. The method of claim 1, wherein forming the oxide includes forming one or more of zirconium oxide, hafnium oxide, or titanium oxide.

4. The method of claim 1, wherein ion implanting oxygen includes implanting oxygen at an energy and a dose to form the oxygen gradient according to a selected gradient.

5. The method of claim 1, wherein forming two electrodes includes forming the two electrodes as a top electrode and a bottom electrode, the bottom electrode formed on a bottom metal pad such that the oxide is formed on the bottom electrode.

6. The method of claim 5, wherein forming the bottom electrode includes forming the bottom electrode such that the bottom electrode is disposed in a dielectric region between the bottom metal pad and the oxide.

7. The method of claim 6, wherein forming the bottom electrode in the dielectric region includes forming the bottom electrode such that the bottom electrode is disposed in a silicon nitride region.

8. The method of claim 1, wherein forming the oxygen gradient in the oxide includes implanting oxygen such that the oxygen gradient is essentially constant from a top surface of the oxide to a location in the oxide less than a thickness of the oxide.

9. The method of claim 1, wherein the method includes using a mask to ion implant the oxygen such that the oxygen implantation occurs in a portion of the oxide less than a width of the oxide along the electrodes arranged essentially parallel to each other.

10. The method of claim 1, wherein ion implanting oxygen includes using a plasma-based implantation to generate an exponential or linear profile of the ion implanted oxygen.

11. The method of claim 1, wherein ion implanting oxygen into the oxide includes ion implanting the oxygen in the form of oxygen clusters.

12. A method comprising:
forming a resistive random access memory cell having an operably variable resistance region formed as an oxide having a thickness between a first surface of the oxide and a second surface of the oxide;
forming a first electrode of the resistive random access memory cell;
ion implanting oxygen into the oxide by ion implanting the oxygen in the form of oxygen clusters such that the implanted oxygen is implanted in the oxide within about 10% of the thickness from the first surface, forming an oxygen gradient in the oxide; and
forming a second electrode on the first surface of the oxide, wherein the oxygen gradient is tailored between the first and second electrodes and is tailored over a horizontal range with respect to one or both of the first and second electrodes.

13. The method of claim 12, wherein ion implanting oxygen includes performing molecular beam implantation to implant oxygen molecules.

14. The method of claim 12, wherein forming the oxide includes forming an oxide having a thickness greater than 0 Å and less than about 500 Å.

15. The method of claim 12, wherein forming the oxide includes forming one or more of zirconium oxide, hafnium oxide, or titanium oxide.

16. The method of claim 12, wherein ion implanting oxygen includes using a plasma-based implantation with an energy in a range from about 0 KeV to about 5 keV.

17. The method of claim 16, wherein using a plasma-based implantation generates an exponential or linear profile of the ion implanted oxygen.

18. A method comprising:
forming a resistive random access memory cell having an operably variable resistance region;
forming a first electrode of the resistive random access memory cell;
forming the operably variable resistance region by forming an oxide on the first electrode;
ion implanting oxygen into the oxide to form an oxygen gradient in the oxide;
forming a buffer region in the resistive random access memory cell; and
forming a second electrode above the oxide, wherein the oxygen gradient is tailored between the first and second electrodes and is tailored over a horizontal range with respect to one or both of the first and second electrodes.

19. The method of claim 18, wherein forming the buffer region includes forming the buffer region between the oxide and the first electrode.

20. The method of claim 18, wherein forming the buffer region includes forming the buffer region between the oxide and the second electrode.

21. The method of claim 18, wherein forming the oxide includes forming one or more of zirconium oxide, hafnium oxide, or titanium oxide.

22. The method of claim 18, wherein using the deposition technique includes using one more of chemical vapor deposition, evaporation, sputtering, molecular beam epitaxy, or atomic layer deposition.

23. A method comprising:
forming a resistive random access memory cell having an operably variable resistance region;
forming a bottom electrode of the resistive random access memory cell;
forming the operably variable resistance region by forming an oxide on the bottom electrode;
ion implanting oxygen into the oxide, forming an oxygen gradient in the oxide;
forming a top electrode on the oxide by forming a conductive material on the oxide such that the conductive material reacts with the oxide enhancing the oxygen gradient, wherein the oxygen gradient is tailored between the top and bottom electrodes and is tailored over a horizontal range with respect to one or both of the top and bottom electrodes des.

24. The method of claim 23, wherein forming the top electrode includes forming titanium nitride.

25. The method of claim 23, wherein forming the oxide, the bottom electrode, and the top electrode includes forming the oxide, the bottom electrode, and the top electrode such that the bottom and top electrodes are substantially aligned vertically in line with each other, the bottom electrode having a first width and the top electrode having a second width, the oxide having a width larger that the first width and larger than the second width, the oxide disposed on a top surface of the bottom electrode and horizontally from both ends of the top surface, the oxide disposed below a bottom surface of the top electrode and horizontally from both ends of the bottom surface.

26. The method of claim 23, wherein forming the oxide includes forming one or more of zirconium oxide, hafnium oxide, or titanium oxide.

27. An apparatus comprising:
 a memory having a plurality of resistive random access memory cells, each resistive random access memory cell including:
  two electrodes; and
  an oxide structured as an operably variable resistance region between the two electrodes, the oxide including an oxygen gradient along an ion implantation region between the two electrodes, wherein the oxygen gradient is tailored between the two electrodes and is tailored over a horizontal range with respect to one or both of the two electrodes.

28. The apparatus of claim 27, wherein the ion implantation region is disposed in the oxide within a distance of about 10% of a thickness of the oxide from one of the two electrodes.

29. The apparatus of claim 27, wherein the oxide includes one or more of zirconium oxide, hafnium oxide, or titanium oxide.

30. The apparatus of claim 27, wherein the resistive random access memory cell includes a plurality of buffer regions between the oxide and one of the two electrodes, the plurality of buffer regions being separate from the two electrodes, the oxide, and interfaces between each of the two electrodes and the oxide.

31. The apparatus of claim 27, wherein at least one of the two electrodes includes material that is reactive with the oxide.

32. The apparatus of claim 27, wherein the oxygen gradient includes an exponential or linear profile of ion implanted oxygen.

* * * * *